(12) United States Patent
Takeuchi

(10) Patent No.: US 11,780,968 B2
(45) Date of Patent: Oct. 10, 2023

(54) HOTMELT SILICONE COMPOSITION, ENCAPSULANT, HOTMELT ADHESIVE AND OPTICAL SEMICONDUCTOR DEVISE

(71) Applicant: DuPont Toray Specialty Materials Kabushiki Kaisha, Tokyo (JP)

(72) Inventor: Shunya Takeuchi, Chiba (JP)

(73) Assignee: Dupont Toray Specialty Materials Kabushiki Kaisha, Tokyo (JP)

( * ) Notice: Subject to any disclaimer, the term of this patent is extended or adjusted under 35 U.S.C. 154(b) by 21 days.

(21) Appl. No.: 17/456,156

(22) Filed: Nov. 22, 2021

(65) Prior Publication Data
US 2022/0162397 A1 May 26, 2022

(30) Foreign Application Priority Data
Nov. 26, 2020 (JP) .................. 2020-195864

(51) Int. Cl.
| | |
|---|---|
| C09D 183/04 | (2006.01) |
| C09J 183/04 | (2006.01) |
| H01L 23/29 | (2006.01) |
| C08G 77/50 | (2006.01) |
| C09J 183/14 | (2006.01) |
| H01L 33/56 | (2010.01) |
| C09D 183/14 | (2006.01) |
| C08G 77/00 | (2006.01) |

(52) U.S. Cl.
CPC ........... C08G 77/50 (2013.01); C09D 183/14 (2013.01); C09J 183/14 (2013.01); H01L 23/296 (2013.01); H01L 33/56 (2013.01); C08G 77/70 (2013.01); C08G 77/80 (2013.01); C08L 2203/206 (2013.01)

(58) Field of Classification Search
CPC .................................................. C08G 77/80
See application file for complete search history.

(56) References Cited

U.S. PATENT DOCUMENTS

2009/0105395 A1 * 4/2009 Kamata .................. C08L 83/04 524/502
2018/0057638 A1 * 3/2018 Kimura .................. B32B 19/02

FOREIGN PATENT DOCUMENTS

| EP | 955328 A2 * | 11/1999 |
|---|---|---|
| EP | 3190156 B1 * | 3/2019 |
| JP | 2006299099 A | 11/2006 |
| JP | 2006324596 A | 11/2006 |
| JP | 2007246894 A | 9/2007 |
| JP | 2013001794 A | 1/2013 |
| WO | 2015194158 A1 | 12/2015 |

OTHER PUBLICATIONS

Machine translation of WO 2013/035736 into English (no date).*

* cited by examiner

Primary Examiner — Marc S Zimmer
(74) Attorney, Agent, or Firm — Lorenz & Kopf LLP

(57) ABSTRACT

Hotmelt silicone compositions are provided including:
(A) a resinous alkenyl group-containing organopolysiloxane component, in which the silicon atom-bonded organic groups do not include an epoxy group-containing organic group, wherein the resinous alkenyl group-containing organopolysiloxane component includes
(A-1) a resinous alkenyl group-containing organopolysiloxane including at least two alkenyl groups per molecule and free from a $(Ar_2SiO_{2/2})$ unit, and
(A-2) a resinous alkenyl group-containing organopolysiloxane including at least two alkenyl groups per molecule and at least one $(Ar_2SiO_{2/2})$ unit;
(B) an organohydrogenpolysiloxane having at least two silicon atom-bonded hydrogen atoms per molecule; and
(C) a curing catalyst.

The resinous alkenyl group-containing organopolysiloxane (A-1) is included in an amount of about 5 mass % or more based on the total mass of all the organopolysiloxane components in the hotmelt silicone composition.

4 Claims, No Drawings

HOTMELT SILICONE COMPOSITION, ENCAPSULANT, HOTMELT ADHESIVE AND OPTICAL SEMICONDUCTOR DEVISE

CROSS-REFERENCE TO RELATED APPLICATION

This application claims priority to Japanese Patent Application No. 2020-195864, filed Nov. 26, 2020, which is incorporated herein by reference it its entirety.

TECHNICAL FIELD

The present disclosure relates to a hotmelt silicone composition, and more specifically relates to a hotmelt silicone composition that is suitable for use in encapsulants for optical semiconductors or hotmelt adhesives. The present disclosure also relates to an optical semiconductor device encapsulated with such an encapsulant.

BACKGROUND

When curable silicone compositions are cured, they form cured products having excellent heat resistance, cold resistance, electrical insulation, weather resistance, water repellency, and transparency, and so they are used in a wide range of industrial fields. In particular, as compared to other organic materials, these cured products are less prone to discoloration and their physical properties deteriorate less, and so they are particularly suitable for optical materials, and in particular are widely used as silicone encapsulants used in optical semiconductor devices such as light emitting diodes (LEDs).

In addition, hotmelt silicone that is curable, non-fluid at room temperature, and melts with heating and turns into fluid has been used as an encapsulant for semiconductor devices or a hotmelt adhesive.

For example, a resin composition for encapsulating optical semiconductor elements is known, which includes an addition curing-type silicone resin composition comprising, as essential components: (A) an organosilicon compound having in one molecule, two or more non-covalent bonding double bond groups, which comprises an organopolysiloxane represented by the following average formulation formula (1): $(R^1{}_3SiO_{3/2})_a(R^2R^3SiO)_b(R^4R^5R^6SiO_{1/2})_c(SiO_{4/2})_d$ (1)(in the formula, $R^1$ to $R^6$ each represent the same or different monovalent hydrocarbon group, 1 to 50 mol % of the total monovalent hydrocarbon group is a non-covalent bonding double bond-containing group, and a, b, c and d are each a positive number showing the molar ratio of the respective siloxane unit, where $a/(a+b+c+d)=0.04\sim0.95$, $b/(a+b+c+d)=0.05\sim0.60$, $c/(a+b+c+d)=0\sim0.05$, $d/(a+b+c+d)=0\sim0.10$, $a+b+c+d=1.0$) in an amount of 30 to 100 mass % of the total of the component (A); (B) an organohydrogenpolysiloxane having in one molecule, two or more hydrogen atoms bonded to a silicon atom; and (C) a catalytic amount of platinum-based catalyst, wherein the organopolysiloxanes of the component (A) and component (B) are free from silanol.

In addition, a heat-curable silicone composition is known comprising, as structural components: (A) an organopolysiloxane having a hydroxyl group amount of 0.5-10 mass %, which is represented by the following average formulation formula (1): $R^1{}_n(C_6H_5)_mSiO_{(4-n-m)/2}$ (where $R^1$ in the formula are non-substituted or substituted monovalent hydrocarbon groups which may be the same or different (excluding a phenyl group), alkoxy groups or hydroxyl groups, in which 30-90 mol % of the total $R^1$ are alkenyl groups, n and m are positive numbers satisfying $1 \leq n+m<2$, $0.20 \leq m/(n+m) \leq 0.95$); (B) an organohydrogenpolysiloxane having in one molecule, at least two hydrogen atoms which bond to a silicon atom, represented by the following average formulation formula (2) $R^2{}_aH_bSiO_{(4-a-b)/2}$ (where $R^2$ in the formula are substituted (excluding epoxy group substitution and alkoxy group substitution) or non-substituted monovalent hydrocarbon groups excluding aliphatic unsaturated hydrocarbon groups, which may be the same or different, and a and b are positive numbers satisfying $0.7 \leq a \leq 2.1$, $0.01 \leq b \leq 1.0$, and $0.8 \leq a+b \leq 3.0$, in such an amount that the molar ratio of the total of silicon atom-bonded hydrogen atoms in components (B) and (D) with respect to the total silicon atom-bonded alkenyl groups in the composition is 0.5 to 4.0; (C) a catalytic amount of an addition reaction catalyst; and (D) one or more compounds selected from organohydrogenpolysiloxane having an epoxy group and/or an alkoxy group, organosilane having an epoxy group and/or an alkoxy group and non-silicon epoxy compound, in an amount of 0.01 to 30 parts by mass with respect to 100 parts by mass of the total amount of components (A) and (B).

In addition, a crosslinkable silicone composition is known that at least includes: (A) an organopolysiloxane represented by average unit formula: $(R^1{}_3SiO_{1/2})_a(R^1{}_2SiO_{2/2})_b(R^1SiO_{3/2})_c(SiO_{4/2})_d(R^2O_{1/2})_e$ (in the formula, $R^1$ is a phenyl group, C1-6 alkyl group or cycloalkyl group, or C2-6 alkenyl group, where 60-80 mol % of $R^1$ are phenyls and 10-20 mol % of $R^1$ are alkenyl groups, $R^2$ is a hydrogen atom or a C1-6 alkyl group, where a, b, c, d and e are numbers satisfying $0 \leq a \leq 0.2$, $0.2 \leq b \leq 0.7$, $0.2 \leq c \leq 0.6$, $0 \leq d \leq 0.2$, $0 \leq e \leq 0.1$, $a+b+c+d=1.0$; (B) an organopolysiloxane represented by general formula: $R^3{}_3SiO(R^3{}_2SiO_{2/2})_mSiR^3{}_3$ (in the formula, $R^3$ is a phenyl group, C1-6 alkyl group or cycloalkyl group, or C2-6 alkenyl group, where 40-70 mol % of $R^3$ are phenyl groups, at least one $R^3$ is an alkenyl group, and m is an integer of 5-100) {in an amount of 0-20 parts by weight with respect to 100 parts by weight of the component (A)}; (C) an organopolysiloxane having in one molecule, two silicon atom-bonded hydrogen atoms, in which 30-70 mol % of the silicon atom-bonded organic groups are phenyl groups {in such an amount that the molar ratio of the silicon atom-bonded hydrogen atoms in this component with respect to the total amount of alkenyl groups in the components (A) and (B) is 0.5-2}; and (D) a hydrosilylation reaction catalyst {in an amount sufficient enough to accelerate the hydrosilylation reaction of alkenyl groups in the components (A) and (B) with silicon atom-bonded hydrogen atoms in the component (C)}.

In addition, patent document 4 describes hotmelt silicone which is non-fluid at 25° C. and has a melt viscosity at 100° C. of 5000 Pa·S or less, the hotmelt silicone being obtained from the hydrosilylation reaction of (A) an alkenyl group-containing organopolysiloxane in which 10 mol % or more of the total silicon atom-bonded organic groups are phenyl groups and (B) an organopolysiloxane having in one molecule at least two silicon atom-bonded hydrogen atoms {in such an amount that the silicon atom-bonded hydrogen atom in this component is 0.2-0.7 mols with respect to 1 mole of the alkenyl group in component (A)}, in the presence of (C) a hydrosilylation reaction catalyst {in an amount sufficient enough to accelerate the hydrosilylation reaction of component (A) with component (B)}.

However, conventional hotmelt silicone compositions had a problem in that high temperature and/or long period of heating are/is required for curing. Consequently, there was a problem in that a pre-curing (pre-baking) process may be required prior to a curing process.

In addition, other objects, desirable features and characteristics will become apparent from the subsequent summary and detailed description, and the appended claims, taken in conjunction with this background.

BRIEF SUMMARY

Hotmelt silicone compositions, encapsulant or hotmelt adhesive which comprises the hotmelt silicone compositions, and optical semiconductor devices are provided herein. In an embodiment, a hotmelt silicone composition includes:
- (A) a resinous alkenyl group-containing organopolysiloxane component, in which the silicon atom-bonded organic groups do not include an epoxy group-containing organic group, wherein the resinous alkenyl group-containing organopolysiloxane component includes
  - (A-1) a resinous alkenyl group-containing organopolysiloxane including at least two alkenyl groups per molecule and free from a ($Ar_2SiO_{2/2}$) unit, and
  - (A-2) a resinous alkenyl group-containing organopolysiloxane including at least two alkenyl groups per molecule and at least one ($Ar_2SiO_{2/2}$) unit;
- (B) an organohydrogenpolysiloxane having at least two silicon atom-bonded hydrogen atoms per molecule; and
- (C) a curing catalyst.

The resinous alkenyl group-containing organopolysiloxane (A-1) is included in an amount of about 5 mass % or more based on the total mass of all the organopolysiloxane components in the hotmelt silicone composition.

DETAILED DESCRIPTION

The following detailed description is merely exemplary in nature and is not intended to limit the disclosure or the application and uses of the subject matter as described herein. Furthermore, there is no intention to be bound by any theory presented in the preceding background or the following detailed description.

An objective of the present disclosure is to provide a hotmelt silicone composition which can be cured at low temperatures within a short period of time while still maintaining the hotmelting properties.

Another objective of the present disclosure is to provide an encapsulant or hotmelt adhesive which includes the hotmelt silicone composition of the present disclosure. Yet another objective of the present disclosure is to provide an optical semiconductor device that is encapsulated with the encapsulant of the present disclosure.

As a result of extensive research to solve the above-mentioned problems, the inventors arrived at the present disclosure upon discovering that, surprisingly, a silicone composition including two types of resinous alkenyl group-containing organopolysiloxanes which has a specific structure exhibits excellent curing properties for low temperature and short period curing while still maintaining hotmelting properties.

Accordingly, the present disclosure relates to a hotmelt silicone composition comprising: (A) a resinous alkenyl group-containing organopolysiloxane component in which the silicon atom-bonded organic groups do not include an epoxy group-containing organic group, which includes (A-1) a resinous alkenyl group-containing organopolysiloxane including at least two alkenyl groups per molecule and free from a ($Ar_2SiO_{2/2}$) unit, and (A-2) a resinous alkenyl group-containing organopolysiloxane including at least two alkenyl groups per molecule and at least one ($Ar_2SiO_{2/2}$) unit; (B) an organohydrogenpolysiloxane having at least two silicon atom-bonded hydrogen atoms per molecule; and (C) a curing catalyst, wherein the component (A-1) is included in an amount of about 5 mass % or more based on the total mass of the organopolysiloxane component.

The component (A-2) is preferably included in an amount of about 50 mass % or less based on the total mass of the organopolysiloxane components.

The component (B) preferably includes a resinous organohydrogenpolysiloxane.

The resinous organohydrogenpolysiloxane is preferably included in an amount of about 15 mass % or more based on the total mass of the organohydrogenpolysiloxane component (B).

The component (A-1) is preferably free from the siloxane unit (unit D) represented by $SiO_{2/2}$.

The component (A-2) preferably includes a silicon atom-bonded alkenyl group in the siloxane unit (unit D) represented by $SiO_{2/2}$.

The component (A) is preferably included in an amount of about 40 mass % or more based on the total mass of all the organopolysiloxane components included in the hotmelt silicone composition of the present disclosure.

The present disclosure also relates to an encapsulant or hotmelt adhesive which comprises the hotmelt silicone composition according to the present disclosure.

The present disclosure also relates to an optical semiconductor device that is encapsulated with the encapsulant according to the present disclosure.

According to the hotmelt silicone composition according to the present disclosure, a hotmelt silicone composition is provided which can be cured at low temperatures within a short period of time while still maintaining the hotmelting properties.

Hotmelt Silicone Composition

The hotmelt silicone composition according to the present disclosure comprises: (A) a resinous alkenyl group-containing organopolysiloxane component in which the silicon atom-bonded organic groups do not include an epoxy group-containing organic group, which includes (A-1) a resinous alkenyl group-containing organopolysiloxane including at least two alkenyl groups per molecule and free from a ($Ar_2SiO_{2/2}$) unit, and (A-2) a resinous alkenyl group-containing organopolysiloxane including at least two alkenyl groups per molecule and at least one ($Ar_2SiO_{2/2}$) unit; (B) an organohydrogenpolysiloxane having at least two silicon atom-bonded hydrogen atoms per molecule; and (C) a curing catalyst, wherein the component (A-1) is included in an amount of 5 mass % or more based on the total mass of the organopolysiloxane component.

The hotmelt silicone composition of the present disclosure is a curable hotmelt silicone composition which cures with a hydrosilylation reaction. The components included in the hotmelt silicone composition of the present disclosure are described in detail below.

(A) Resinous Alkenyl Group-Containing Organopolysiloxane Component, in Which the Silicon Atom-Bonded Organic Groups do not Include an Epoxy Group-Containing Organic Group The inventive hotmelt silicone composition includes, as a main component, (A) a resinous alkenyl group-containing organopolysiloxane component that includes organopolysiloxanes having at least two alkenyl groups per molecule. In the present specification, resinous organopolysiloxanes refer to organopolysiloxanes that have a branched or network molecular structure. In the present specification, component (A) is a resinous alkenyl group-containing organopolysiloxane component in which the silicon atom-bonded organic groups do not include an epoxy group-containing organic group.

Examples of the alkenyl group which may be included in component (A) organopolysiloxanes include C2-12 alkenyl groups such as vinyl, allyl, butenyl, pentenyl, hexenyl, heptenyl, octenyl, nonenyl, decenyl, undecenyl, and dodecenyl groups, and vinyl groups are preferred.

Examples of a group that bonds to a silicon atom other than the alkenyl group in component (A) include halogen-substituted or unsubstituted monovalent hydrocarbon groups other than alkenyl groups, and specific examples include: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms. The silicon atoms in component (A) may have a small quantity of hydroxyl groups or an alkoxy group such as a methoxy group or ethoxy group within a range that does not hinder the objectives of the present disclosure. Silicon atom-bonded groups other than alkenyl groups in component (A) are preferably selected from among C1-6 alkyl groups, particularly methyl groups, and C6-20 aryl groups, particularly phenyl groups.

The component (A) of the present disclosure includes at least two types of resinous alkenyl group-containing organopolysiloxanes of (A-1) a resinous alkenyl group-containing organopolysiloxane including at least two alkenyl groups per molecule and free from a $(Ar_2SiO_{2/2})$ unit, and (A-2) a resinous alkenyl group-containing organopolysiloxane including at least two alkenyl groups per molecule and at least one $(Ar_2SiO_{2/2})$ unit. The components are described in detail below.

(A-1) Resinous Alkenyl Group-Containing Organopolysiloxane Including at Least Two Alkenyl Groups per Molecule and Free from a $(Ar_2SiO_{2/2})$ Unit.

The component (A-1) is a resinous organopolysiloxane including at least two alkenyl groups per molecule and free from a $(Ar_2SiO_{2/2})$ unit. The hotmelt silicone composition according to the present disclosure may comprise one kind of component (A-1), or two or more kinds of component (A-1) may be used in combination.

According to an embodiment of the present disclosure, the resinous alkenyl group-containing organopolysiloxane of component (A-1) can be preferably represented by average unit formula (I): $(R^1_3SiO_{1/2})_a(R^1_2SiO_{2/2})_b(R^1SiO_{3/2})_c(SiO_{4/2})_d(XO_{1/2})_e$ (in the formula (I), $R^1$ are the same or different optionally halogen-substituted monovalent hydrocarbon groups, but at least two $R^1$ per molecule are alkenyl groups, X is a hydrogen atom or an alkyl group, $0 \leq a < 1$, $0 \leq b < 1$, $0 \leq c < 0.9$, $0 \leq d \leq 0.5$, $0 \leq e < 0.4$, $a+b+c+d=1.0$ and $c+d>0$ are satisfied, and an $(Ar_2SiO_{2/2})$ unit is not included).

Examples of the optionally halogen-substituted monovalent hydrocarbon groups of $R^1$ in the above formula (I) include: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and any of these groups in which some or all of the hydrogen atoms are substituted with halogen atoms such as fluorine, chlorine, and bromine atoms. $R^1$ may also be a hydroxyl group or an alkoxy group such as a methoxy or ethoxy group, in small amounts, within a range that does not adversely affect the object of the present disclosure. $R^1$ is preferably selected from among C1-6 alkyl groups, particularly a methyl group, C2-6 alkenyl groups, particularly a vinyl group, or C6-20 aryl groups, particularly a phenyl group.

In Formula (I) above, X is a hydrogen atom or an alkyl group. Preferred examples of alkyl groups represented by X include C1-3 alkyl groups, specifically methyl, ethyl, and propyl groups.

In Formula (I) above, a is preferably in the range of $0.1 \leq a \leq 0.8$, more preferably in the range of $0.15 \leq a \leq 0.6$, even more preferably in the range of $0.2 \leq a \leq 0.4$. In Formula (I) above, b is preferably in the range of $0 \leq b \leq 0.3$, more preferably in the range of $0 \leq b \leq 0.2$, and particularly in the range of $0 \leq b \leq 0.1$. In Formula (I) above, c is preferably in the range of $0.2 \leq c < 0.9$, more preferably in the range of $0.4 \leq c \leq 0.85$, and particularly in the range of $0.6 \leq c \leq 0.8$. In Formula (I) above, d is preferably in the range of $0 \leq d \leq 0.3$, more preferably in the range of $0 \leq d \leq 0.2$, and particularly in the range of $0 \leq d \leq 0.1$. In Formula (I) above, e is preferably in the range of $0 \leq e \leq 0.15$, more preferably in the range of $0 \leq e \leq 0.1$, and particularly in the range of $0 \leq e \leq 0.05$.

According to a preferred embodiment of the present disclosure, the resinous alkenyl group-containing organopolysiloxane of component (A-1) is such that, in Formula (I) above, c is greater than 0, which is to say that it includes a siloxane unit (unit T) represented by $SiO_{3/2}$. The resinous organopolysiloxane of component (A-1) may or may not, and preferably does not, include a siloxane unit (unit Q) represented by $SiO_{4/2}$. According to a preferred embodiment of the present disclosure, the resinous alkenyl group-containing organopolysiloxane of component (A-1) includes alkenyl groups at the molecular terminal. The resinous organopolysiloxane of component (A-1) preferably has alkenyl groups in the siloxane units represented by $SiO_{1/2}$ (unit M), and may or may not, and preferably does not, have alkenyl groups in molecular-chain side chains (which is to say, siloxane units represented by $SiO_{2/2}$ (unit D) and siloxane units represented by $SiO_{3/2}$ (unit T).

According to a preferred embodiment of the present disclosure, the resinous alkenyl group-containing organopolysiloxane of component (A-1) may or may not include, but preferably does not include, unit D. Accordingly, according to a preferred embodiment of the present disclosure, b in the abovementioned formula (I) is about 0.05 or less, more preferably about 0.02 or less, even more preferably about 0.01 or less, particularly preferably 0.

The content of the alkenyl groups in all of the silicon atom-bonded organic groups of the resinous alkenyl group-containing organopolysiloxane of component (A-1) is not particularly limited, and for example, can be about 5 mol % or more, preferably about 10 mol % or more, more preferably about 15 mol % or more of the total of the silicon atom-bonded organic groups, and about 40 mol % or less, preferably about 30 mol %, more preferably about 20 mol % or less of the total of the silicon atom-bonded organic groups. In the present specification, the alkenyl group content can be determined using analysis such as Fourier transform infrared spectrophotometry (FT-IR) or nuclear magnetic resonance (NMR), or by using a titration method described below.

A method for determining the alkenyl group amount in the components by using titration will be described. The alkenyl group content in the organopolysiloxane components can be accurately quantified by using a titration method generally known as the Wijs method. The principle will be described below. Firstly, an alkenyl group in the organopolysiloxane starting material and iodine monochloride are subjected to an addition reaction as shown in Formula (1). Next, according to the reaction shown in formula (2), an excess amount of iodine monochloride is reacted with potassium iodide, thereby freeing iodine. The freed iodine is subjected to titration with a sodium thiosulfate solution.

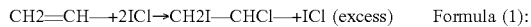

CH2=CH—+2ICl→CH2I—CHCl—+ICl (excess)  Formula (1):

ICl+KI→I$_2$+KCl  Formula (2):

The alkenyl group amount in the component can be quantified from the difference between the amount of sodium thiosulfate required for titration and the titration amount of the blank solution prepared separately.

According to a preferred embodiment of the present disclosure, the resinous alkenyl group-containing organopolysiloxane of component (A-1) includes an aryl group in the silicon atom-bonded organic group. That is to say, in Formula (I) above, at least one $R^1$ can be an aryl group. According to a preferred embodiment of the disclosure, the resinous alkenyl group-containing organopolysiloxane of component (A-1) comprises a silicon atom-bonded aryl group in a molecular-chain side chain, that is, in the unit D or unit T, preferably in the unit T. The resinous alkenyl group-containing organopolysiloxane of component (A-1) may or may not, and preferably does not, include an aryl group at the molecular terminal, that is, in the unit M. Note that, in terms of the aryl group, C6-20 aryl groups, and particularly a phenyl group, a tolyl group, a xylyl group, and a naphthyl group can be mentioned.

When the (A-1) component resinous organopolysiloxane of comprises an aryl group, the content (mol % of aryl groups in all of the silicon atom-bonded functional groups of the resinous organopolysiloxane) can be designed as desired, but is normally about 5 mol % or more, preferably about 10 mol % or more, more preferably about 20 mol % or more, still more preferably about 30 mol % or more, preferentially about 40 mol % or more, and particularly preferably about 45 mol % or more, and can be about 80 mol % or less, preferably about 70 mol % or less, more preferably about 65 mol % or less, preferentially about 60 mol % or less, and particularly preferably about 55 mol % or less. The aryl group content can, for example, be determined by analysis such as Fourier transform infrared spectrophotometry (FT-IR) or nuclear magnetic resonance (NMR).

According to a preferred embodiment of the present disclosure, the component (A-1) can be represented by the average unit formula (I-2): $(R^{1'}_3SiO_{1/2})_a(R^{1''}SiO_{3/2})_c$ (in the formula (I-2), $R^{1'}$ are the same or different optionally halogen-substituted monovalent hydrocarbon groups other than aryl groups, where at least two $R^{1'}$ per molecule are alkenyl groups, and $R^{1''}$ are the same or different optionally halogen-substituted monovalent hydrocarbon groups other than alkenyl groups, where at least one $R^{1''}$ per molecule is an aryl group, and 0<a<1, 0<c<0.9, and a+c=1.0).

The optionally halogen-substituted monovalent hydrocarbon groups, alkenyl groups, aryl groups, a and c in the formula (I-2) have the same meanings as those described for the abovementioned formula (I).

The resinous organopolysiloxane of component (A-1) is included in an amount of about 5 mass % or more based on the total mass of all the organopolysiloxane components included in the hotmelt silicone composition of the present disclosure. The component (A-1) is preferably included in an amount of about 7 mass % or more, and more preferably about 9 mass % or more, based on the total mass of all organopolysiloxane components included in the hotmelt silicone composition of the present disclosure. In addition, the content of component (A-1) is preferably about 70 mass % or less, more preferably about 60 mass % or less, even more preferably about 50 mass % or less, and particularly preferably about 45 mass % or less, based on the total mass of all organopolysiloxane components included in the hot-melt silicone composition of the present disclosure.

(A-2) Resinous Alkenyl Group-Containing Organopolysiloxane Including at Least Two Alkenyl Groups per Molecule and at Least One $(Ar_2SiO_{2/2})$ Unit The component (A-2) is a resinous organopolysiloxane including at least two alkenyl groups per molecule and at least one $(Ar_2SiO_{2/2})$ unit. The hotmelt silicone composition according to the present disclosure may include one type of component (A-2) or may include two or more types of component (A-2) in combination.

According to an embodiment of the present disclosure, the resinous alkenyl group-containing organopolysiloxane of component (A-2) is preferably represented by average unit formula (II): $(R^1_3SiO_{1/2})_a(R^1_2SiO_{2/2})_b(Ar_2SiO_{2/2})_{b'}$ $(R^1SiO_{3/2})_c(SiO_{4/2})_d(XO_{1/2})_e$ (In formula (II), $R^1$ are the same or different optionally halogen-substituted monovalent hydrocarbon groups, where at least two $R^1$ per molecule are alkenyl groups, X is a hydrogen atom or an alkyl group, Ar represents an aryl group, 0≤a<1, 0≤b<1, 0≤b'<1.0, 0≤c<0.9, 0≤d<0.5, 0≤e<0.4, a+b+b'+c+d=1.0 and c+d>0).

In formula (II) above, the same groups as in formula (I) above can be used for the optionally halogen-substituted monovalent hydrocarbon group of R'. In formula (II) above, Ar represents an aryl group, and in terms of the aryl group, C6-20 aryl groups, and particularly a phenyl group, a tolyl group, a xylyl group, and a naphthyl group can be mentioned.

In formula (II) above, a is preferably in the range 0≤a≤0.5, more preferably in the range 0≤a≤0.3, very preferably in the range 0≤a≤0.2, and particularly preferably in the range 0≤a≤0.1. In average unit formula (II), b is preferably in the range 0≤b≤0.8, more preferably in the range 0.1≤b≤0.7, and particularly preferably in the range 0.15≤b≤0.6. In average unit formula (II), b' is preferably in the range 0.1≤b'≤0.7, more preferably in the range 0.2≤b'≤0.6, and particularly preferably in the range 0.25≤b'≤0.5. In average unit formula (II), c is preferably in the range 0.1≤c≤0.95, more preferably in the range 0.2≤c≤0.85, and particularly preferably in the range 0.3≤c≤0.8. In average unit formula (II), d is preferably in the range 0.≤d≤0.4, more preferably in the range 0≤d≤0.3, and particularly preferably in the range 0≤d≤0.2. In average unit formula (II), e is preferably in the range 0≤e≤0.3, more preferably in the range 0≤e≤0.2, and particularly preferably in the range 0≤e≤0.1.

In a preferred embodiment of the present disclosure, the resinous alkenyl group-containing organopolysiloxane of component (A-2) is such that, in formula (II) above, c is greater than 0, which is to say that it includes a siloxane unit represented by $SiO_{3/2}$ (unit T). The resinous organopolysiloxane of component (A-2) may or may not, and preferably does not, include a siloxane unit represented by $SiO_{4/2}$ (unit Q).

In a preferred embodiment of the present disclosure, the resinous alkenyl group-containing organopolysiloxane of component (A-2) includes alkenyl groups at the molecular side chain. The resinous organopolysiloxane of component (A-2) includes an alkenyl group in unit D, and may or may not, and preferably does not, include an alkenyl group at the molecular terminal, that is, in the unit M.

In a preferred embodiment of the present disclosure, the resinous alkenyl group-containing organopolysiloxane of component (A-2) may or may not include, but preferably does not include, unit M. Accordingly, in a preferred embodiment of the present disclosure, a in formula (II) is about 0.05 or less, more preferably about 0.02 or less, even more preferably about 0.01 or less, particularly preferably 0.

The content of the alkenyl groups in all of the silicon atom-bonded organic groups of the resinous alkenyl group-containing organopolysiloxane of component (A-1) is not particularly limited, and for example, can be about 5 mol % or more, preferably about 10 mol % or more, more preferably about 15 mol % or more of the total of the silicon atom-bonded organic groups, and about 40 mol % or less, preferably about 30 mol %, more preferably about 20 mol % or less of the total of the silicon atom-bonded organic groups.

In a preferred embodiment of the disclosure, the resinous alkenyl group-containing organopolysiloxane of component (A-2) comprises a silicon atom-bonded aryl group in a molecular-chain side chain, that is, in unit D or unit T, more preferably comprises a silicon atom-bonded aryl group in both unit D and unit T. The resinous alkenyl group-containing organopolysiloxane of component (A-2) may or may not, and preferably does not, include an aryl group at the molecular terminal, that is, in the unit M. Note that, in terms of the aryl group, C6-20 aryl groups, and particularly a phenyl group, a tolyl group, a xylyl group, and a naphthyl group can be mentioned.

The content of the aryl group in component (A-2) (mol % of aryl groups in all of the silicon atom-bonded functional groups of the resinous organopolysiloxane) can be designed as desired, but is normally about 10 mol % or more, preferably about 20 mol % or more, more preferably about 30 mol % or more, still more preferably about 40 mol % or more, preferentially about 50 mol % or more, and particularly preferably about 55 mol % or more, and can be about 80 mol % or less, preferably about 75 mol % or less, more preferably about 70 mol % or less, preferentially about 65 mol % or less, and particularly preferably about 60 mol % or less.

According to a preferred embodiment of the present disclosure, the component (A-2) can be represented by average unit formula (II-2): $(R^{1'}_2SiO_{2/2})_b(Ar_2SiO_{2/2})_{b'}(R^{1''}SiO_{3/2})_c$ (In formula (II-2), $R^{1'}$ are the same or different optionally halogen-substituted monovalent hydrocarbon groups other than aryl groups, where at least two $R^{1'}$ per molecule are alkenyl groups, $R^{1''}$ are the same or different optionally halogen-substituted monovalent hydrocarbon groups other than alkenyl groups, where at least one $R^{1''}$ per molecule is an aryl group, Ar represents an aryl group, $0<b<1$, $0<b'<1.0$, $0<c<0.9$, and $b+b'+c=1.0$.

In formula (II-2) above, optionally halogen-substituted monovalent hydrocarbon groups, alkenyl groups, aryl groups, b, b', and c have the same meanings as those described for the abovementioned formula (II).

The content of the resinous organopolysiloxane of component (A-2) is not particularly limited, but is preferably about 2% by mass or more, more preferably about 5% by mass or more, still more preferably about 10% by mass or more, and particularly preferably about 15% by mass or more, based on the total mass of all the organopolysiloxane components included in the hotmelt silicone composition of the present disclosure. In addition, the content of component (A-2) is preferably about 60% by mass or less, more preferably about 55% by mass or less, even more preferably about 50% by mass or less, and particularly preferably about 48% by mass or less, based on the total mass of all organopolysiloxane components included in the hotmelt silicone composition of the present disclosure.

In a preferred embodiment of the present disclosure, the content of (A) the resinous alkenyl group-containing organopolysiloxane component, which includes component (A-1) and component (A-2), is not particularly limited, but it is included in an amount of preferably about 20 mass % or more, more preferably about 30 mass % or more, even more preferably about 40 mass % or more, preferentially about 45 mass % or more, particularly preferably about 50 mass % or more, based on the total mass of all the organopolysiloxane components included in the hotmelt silicone composition of the present disclosure. The content of the resinous alkenyl group-containing organopolysiloxane of component (A) is preferably about 90 mass % or less, more preferably about 80 mass % or less, even more preferably about 70 mass % or less, particularly preferably about 60 mass % or less, based on the total mass of all the organopolysiloxane components included in the hotmelt silicone composition of the present disclosure.

The mass ratio of component (A-1) and component (A-2) is not particularly limited, but the mass ratio of the component (A-1) content to the component (A-2) content is preferably in the range of from about 0.1 to about 5, more preferably in the range of from about 0.15 to about 4, even more preferably in the range of from about 0.2 to about 3.

(B) Organohydrogenpolysiloxane Having at Least Two Silicon Atom-Bonded Hydrogen Atoms per Molecule Component (B) is an organohydrogenpolysiloxane which acts as a cross-linking agent for a hotmelt silicone composition by way of a hydrosilylation curing reaction and has at least two silicon atom-bonded hydrogen atoms per molecule. The hotmelt silicone composition according to the present disclosure may comprise one type of a (B) organohydrogenpolysiloxane or may comprise two or more types of (B) organohydrogenpolysiloxane.

Examples of the molecular structure of the component (B) are linear, linear with some branching, branched, resinous, cyclic, and 3D network structures. Component (B) can be one organohydrogenpolysiloxane having such a molecular structure, or a mixture of two or more such organohydrogenpolysiloxanes having such a molecular structure. Preferably, the hotmelt silicone composition of the present disclosure includes a resinous organohydrogenpolysiloxane, more preferably includes both linear organohydrogenpolysiloxane and resinous organohydrogenpolysiloxane as the component (B).

Examples of silicon atom-bonded groups other than silicon atom-bonded hydrogen atoms included in the component (B) include optionally halogen-substituted monovalent hydrocarbon groups other than alkenyl groups, for example, C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms. The silicon atoms in component (B) may also have a small amount of hydroxyl groups or alkoxy groups such as methoxy or ethoxy groups within the range of not impairing the objectives of the present disclosure. Silicon atom-bonded groups other than silicon atom-bonded hydrogen atoms in the component (B) are preferably selected from among C1-6 alkyl groups, particularly methyl groups, and C6-20 aryl groups, particularly phenyl groups.

In one embodiment of the present disclosure, the component (B) can include a resinous organohydrogenpolysiloxane as a component (B-1). The resinous organohydrogenpolysiloxane (B-1) can be preferably represented by the average unit formula (III): $(R^2_3SiO_{1/2})_a(R^2_2SiO_{2/2})_b(R^2SiO_{3/2})_c(SiO_{4/2})_d(XO_{1/2})_e$, (In formula (III), $R^2$ are hydrogen atoms or the same or different optionally halogen-substituted monovalent hydrocarbon groups, where at least two $R^2$ per molecule are hydrogen atoms, $0 \le a < 1$, $0 \le b < 1$, $0 \le c < 0.9$, $0 \le d < 0.5$, $0 \le e < 0.4$, $a+b+c+d=1.0$ and $c+d>0$.

Examples of the optionally halogen-substituted monovalent hydrocarbon groups other than alkenyl groups of $R^2$ in formula (III) above include C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms. $R^2$ may also be a hydroxyl group or an alkoxy group such as methoxy or ethoxy, in small amounts, within the range of not impairing the objective of the present disclosure. $R^2$ is preferably selected from among a hydrogen atom, C1-6 alkyl groups, particularly a methyl group, or C6-20 aryl groups, particularly a phenyl group.

X in formula (III) above is a hydrogen atom or an alkyl group. Preferred examples of alkyl groups represented by X include C1-3 alkyl groups, specifically methyl, ethyl, and propyl groups.

In formula (III) above, a is preferably in the range of $0.1 \le a \le 0.9$, more preferably in the range of $0.3 \le a \le 0.8$, even more preferably in the range of $0.5 \le a \le 0.7$. In formula (III) above, b is preferably in the range of $0 \le b \le 0.5$, more preferably in the range of $0 \le b \le 0.3$, and particularly in the range of $0 \le b \le 0.1$. In formula (III) above, c is preferably in the range of $0.1 \le c \le 0.7$, more preferably in the range of $0.2 \le c \le 0.6$, and particularly in the range of $0.3 \le c \le 0.5$. In formula (III) above, d is preferably in the range of $0 \le d \le 0.4$, more preferably in the range of $0 \le d \le 0.25$, and particularly in the range of $0 \le d \le 0.1$. In formula (III) above, e is preferably in the range of $0 \le e \le 0.15$, more preferably in the range of $0 \le e \le 0.1$, and particularly in the range of $0 \le e \le 0.05$.

In a preferred embodiment of the present disclosure, the resinous organohydrogenpolysiloxane of component (B-1) is such that c in formula (III) above is greater than 0, that is, it includes unit T. The resinous organohydrogenpolysiloxane of component (B-1) may or may not, but preferably does not, include unit Q.

In a preferred embodiment of the present disclosure, the resinous organohydrogenpolysiloxane of component (B-1) comprises a silicon atom-bonded hydrogen atom at a molecular terminal. The resinous organohydrogenpolysiloxane of component (B-1) preferably has a silicon atom-bonded hydrogen atom in unit M, and may or may not, and preferably does not, include a silicon atom-bonded hydrogen atom in molecular-chain side chains (that is, unit D and unit T).

In a preferred embodiment of the present disclosure, the resinous organohydrogenpolysiloxane of component (B-1) comprises an aryl group for a silicon atom-bonded organic group. That is to say, in formula (III) above, at least one $R^2$ can be an aryl group. In a preferred embodiment of the disclosure, the resinous organohydrogenpolysiloxane of component (B-1) comprises an aryl group in the molecular side chain, that is, in unit D or unit T, and preferably includes a silicon atom-bonded aryl group in unit T. The resinous organohydrogenpolysiloxane of component (B-1) may or may not, and preferably does not, include an aryl group at the molecular terminal, that is, in unit M. Note that, in terms of the aryl group, C6-20 aryl groups, and particularly a phenyl group, a tolyl group, a xylyl group, and a naphthyl group can be mentioned.

When the resinous organohydrogenpolysiloxane of component (B-1) comprises an aryl group, the content thereof (mol % of aryl groups in all of the silicon atom-bonded functional groups of the resinous organohydrogenpolysiloxane) can be designed as desired, but is normally about 1 mol % or more, preferably about 5 mol % or more, more preferably about 10 mol % or more, still more preferably about 13 mol % or more, and particularly preferably about 16 mol % or more, and can be about 50 mol % or less, preferably about 40 mol % or less, more preferably about 35 mol % or less, preferentially about 30 mol % or less, and particularly preferably about 25 mol % or less.

Accordingly, in a preferred embodiment of the present disclosure, component (B-2) can be represented by the average unit formula (III-2): $(R^{2'}_3SiO_{1/2})_a(R^{2''}SiO_{3/2})_c$ (in formula (III-2), $R^{2'}$ are hydrogen atoms or the same or different optionally halogen-substituted monovalent hydrocarbon group other than alkenyl groups and aryl groups, where at least two $R^{2'}$ per molecule are hydrogen atoms and $R^{2''}$ is an optionally halogen-substituted monovalent hydrocarbon group other than alkenyl groups, and at least one $R^{2''}$ is an aryl group per molecule, and $0<a<1$, $0<c<0.9$, and $a+c=1.0$.

In formula (III-2) above, optionally halogen-substituted monovalent hydrocarbon groups, alkenyl groups, aryl groups, and a and c have the same meanings as those described for the abovementioned formula (III).

The viscosity of the organopolysiloxane of component (B-1) is not particularly limited, but is, for example, in the range of from about 1 mPa to about 1000 mPa at 25° C.

When the component (B) includes (B-1) the resinous organohydrogenpolysiloxane, the content thereof is not particularly limited, but is preferably about 1% by mass or more, more preferably about 2% by mass or more, still more preferably about 3% by mass or more, and particularly preferably about 5% by mass or more, based on the total mass of all the organopolysiloxane components included in the hotmelt silicone composition of the present disclosure. The content of component (B-1) is preferably about 25% by mass or less, more preferably 20% by mass or less, even more preferably about 15% by mass or less, and particularly preferably about 10% by mass or less, based on the total mass of all organopolysiloxane components included in the hotmelt silicone composition of the present disclosure.

The component (B) may include a linear organohydrogenpolysiloxane as component (B-2). The linear organohydrogenpolysiloxane component of component (B-2) can be preferably represented by the average structural formula (IV): $R^2_3SiO(R^2_2SiO_{2/2})_mSiR^2_3$ (in the formula (IV), $R^2$ are hydrogen atoms or the same or different optionally halogen-substituted monovalent hydrocarbon groups other than alkenyl groups, but at least two $R^2$ per molecule are hydrogen atoms, and m is from 1 to about 100).

In formula (IV) above, the same groups as in formula (III) above can be used for the optionally halogen-substituted monovalent hydrocarbon groups other than alkenyl groups of $R^2$.

In formula (IV) above, m is preferably from 1 to about 50, more preferably from 1 to about 20, still more preferably from 1 to about 10, and particularly preferably from 1 to about 5.

According to a preferred embodiment of the present disclosure, the linear organohydrogenpolysiloxane of component (B-2) comprises a silicon atom-bonded hydrogen atom at both ends of the molecular chain. The linear organohydrogenpolysiloxane of component (B-2) has a silicon atom-bonded hydrogen atom in the unit M and may or may not, but preferably does not, include a silicon atom-bonded hydrogen atom in unit D.

The (B-2) component linear organohydrogenpolysiloxane preferably has (unit D) a silicon atom-bonded aryl group in a molecular-chain side chain. The (B-2) component linear organopolysiloxane may or may not, but preferably does not, include an aryl group (unit M) in a molecular terminal. Specifically, in an embodiment of the present disclosure, component (B) comprises resinous organopolysiloxane comprising at least one $(Ar_2SiO_{2/2})$ unit.

According to one embodiment of the present disclosure, when the linear organohydrogenpolysiloxane of component (B-2) includes an aryl group, the content of the aryl group in all of the silicon atom-bonded organic groups is not particularly limited, and for example, it is about 10 mol % or more, preferably about 15 mol % or more, more preferably about 20 mol % or more of the total of the silicon atom-bonded organic groups, and can be about 50 mol % or less, preferably about 40 mol %, more preferably about 30 mol % or less of the total of the silicon atom-bonded organic groups.

When component (B) includes (B-2) the linear organohydrogenpolysiloxane, the content thereof is not particularly limited, but it can be included in an amount of preferably about 1 mass % or more, more preferably about 5 mass % or more, still more preferably about 10 mass % or more, particularly preferably about 15 mass % or more, based on the total mass of all the organopolysiloxane components of the hotmelt silicone composition of the present disclosure, and furthermore can be included in an amount of about 40 mass % or less, preferably about 35 mass % or less, more preferably about 30 mass % or less, particularly preferably about 25 mass % or less, based on the total mass of all the organopolysiloxane components of the hotmelt silicone composition of the present disclosure.

The content of the total component (B) is not particularly limited, but is preferably about 5% by mass or more, more preferably about 10% by mass or more, still more preferably about 15% by mass or more, and particularly preferably about 20% by mass or more, based on the total mass of the hotmelt silicone composition of the present disclosure. In a preferred embodiment, the component (B) can be included in an amount of about 50% by mass or less, more preferably about 40% by mass or less, and still more preferably about 30% by mass or less, based on the total mass of the hotmelt silicone composition of the present disclosure.

In one embodiment of the present disclosure, the content of (B-1) the resinous organohydrogenpolysiloxane in the total component (B) is not particularly limited, but it is included in an amount of preferably about 5 mass % or more, more preferably about 10 mass % or more, even more preferably about 15 mass % or more, particularly preferably about 18 mass % or more, based on the total mass of (B) the organohydrogenpolysiloxane components. In a preferred embodiment, the content of (B-1) the resinous organohydrogenpolysiloxane is included in an amount of about 50 mass % or less, preferably about 40 mass % or less, even more preferably about 30 mass % or less, based on the total mass of (B) the organohydrogenpolysiloxane components.

Further, in one embodiment of the present disclosure, (B) the component is included in an amount such that the ratio of the silicon atom-bonded alkenyl groups to the silicon atom-bonded hydrogen atoms included in the organopolysiloxane component is such that, with respect to 1 mol of the silicon atom-bonded alkenyl groups in the hotmelt silicone composition, the silicon atom-bonded hydrogen atoms constitute about 0.5 mol or more, preferably about 0.8 mol or more, more preferably about 0.95 mol or more, and also, it is included in an amount such that, with respect to 1 mole of silicon atom-bonded alkenyl group in the hotmelt silicone composition, the silicon atom-bonded hydrogen atoms are about 3 mol or less, preferably about 2 mol or less, more preferably about 1.6 mol or less, even more preferably about 1.4 mol or less, particularly preferably about 1.2 mol or less.

(C) Curing Catalyst

The curing catalyst of component (C) is a hydrosilylation reaction curing catalyst, and is a catalyst for promoting the curing of the hotmelt silicone composition of the present disclosure. Examples of component (C) are platinum-based catalysts such as chloroplatinic acid, alcohol solution of chloroplatinic acid, platinum-olefin complex, platinum-1,3-divinyl-1,1,3,3-tetramethyldisiloxane complex, and platinum-supporting powder; palladium-based catalysts such as tetrakis(triphenylphosphine)palladium, and mixtures of triphenylphosphine and palladium black; and rhodium-based catalysts; platinum-based catalysts are particularly preferred.

The amount of component (C) blended is the catalytic amount, and more specifically when a platinum-based catalyst is used as component (C), based on the total mass of the hotmelt silicone composition of the present disclosure, the amount of platinum atoms is preferably about 0.1 ppm or more, and more preferably about 1 ppm or more, even more preferably about 3 ppm or more, particularly preferably about 5 ppm or more, and based on the total mass of the hotmelt silicone composition of the present disclosure, the amount of platinum atoms is preferably about 20 ppm or less, more preferably about 15 ppm or less, still more preferably about 10 ppm or less.

(D) Other Organopolysiloxane Components

The hotmelt silicone composition of the present disclosure can also include other organopolysiloxane components in addition to the organopolysiloxane components (A) and (B) mentioned above.

(D-1) Linear Alkenyl Group-Containing Organopolysiloxane

The hotmelt silicone composition of the present disclosure may include a linear alkenyl group-containing organopolysiloxane having at least two alkenyl groups per molecule as component (D-1). The hotmelt silicone composition of the present disclosure may comprise one type of component (D-1), or two or more types of component (D-1) in combination.

The linear alkenyl group-containing organopolysiloxane of component (D-1 can be preferably represented by average structural formula (V): $R^3{}_3SiO(R^3{}_2SiO_{2/2})_m SiR^3{}_3$ (in formula (V), $R^3$ are the same or different optionally halogen-substituted monovalent hydrocarbon groups, where at least two $R^3$ are alkenyl groups in one molecule, and m is from 1 to about 500).

In formula (V) above, the same groups as $R^1$ in formula (I) above can be used for the optionally halogen-substituted monovalent hydrocarbon groups of $R^3$.

In formula (V) above, m is preferably 2 to about 300, more preferably about 5 to about 200, still more preferably from about 10 to about 150, and particularly preferably from about 15 to about 100.

Examples of such a component (D-1) include dimethylpolysiloxane capped at both ends of the molecular chain with dimethylvinylsiloxy groups, dimethylpolysiloxane capped at both ends of the molecular chain with diphenylvinylsiloxy groups, dimethylsiloxane-methylphenylsiloxane copolymers capped at both ends of the molecular chain with dimethylvinylsiloxy groups, dimethyl siloxane-diphenylsiloxane copolymers capped at both ends of the molecular chain with dimethylvinylsiloxy groups, dimethyl siloxane-methylphenylsiloxane copolymers capped at both ends of the molecular chain with diphenylvinylsiloxy groups, dimethyl siloxane-methylvinylsiloxane copolymers capped at both ends of the molecular chain with dimethylvinylsiloxy groups, dimethylsiloxane-methylphenylsiloxane-methylvinylsiloxane copolymers capped at both ends of the molecular chain with dimethylvinylsiloxy groups, dimethyl siloxane-diphenylsiloxane-methylvinylsiloxane copolymers capped at both ends of the molecular chain with dimethylvinylsiloxy groups, methylvinylpolysiloxane capped at both ends of the molecular chain with trimethylsiloxy groups, methylvinylsiloxane-methylphenylsiloxane copolymers capped at both ends of the molecular chain with trimethylsiloxy groups, methylvinylsiloxane-diphenylsiloxane copolymers capped at both ends of the molecular chain with trimethylsiloxy groups, and dimethylsiloxane-methylvinylsiloxane copolymers capped at both ends of the molecular chain with trimethylsiloxy groups.

According to a preferred embodiment of the present disclosure, the linear alkenyl group-containing organopolysiloxane of component (D-1) may be a linear organopolysiloxane that has alkenyl groups at both molecular terminals in which both ends of the molecular chain are capped with alkenyl groups. The linear organopolysiloxane of component (D-1) may or may not, but preferably does not, include an alkenyl group in a molecular-chain side chain (that is, unit D).

The alkenyl group content (mol % of alkenyl groups in all silicon atom-bonded functional groups of the linear organopolysiloxane) included in the linear organopolysiloxane of component (D-1) can be designed as desired, but is normally about 0.005 mol % or more, preferably about 0.01 mol % or more, and can be about 20 mol % or less, preferably about 15 mol % or less, more preferably about 10 mol % or less, and preferentially about 7 mol % or less.

In one embodiment of the present disclosure, the linear organopolysiloxane of component (D-1) includes an aryl group in a silicon atom-bonded organic group. That is to say, in formula (V) above, at least one $R^3$ can be an aryl group. According to a preferred embodiment of the present disclosure, the linear alkenyl group-containing organopolysiloxane of component (D-1) has a silicon atom-bonded aryl group in a molecular-chain side chain (unit D). The linear organopolysiloxane of component (D-1) may or may not, but preferably does not, include an aryl group at a molecular chain terminal (that is, unit M).

When the linear organopolysiloxane of component (D-1) comprises an aryl group, the content (mol % of aryl groups in all of the silicon atom-bonded functional groups of the linear organopolysiloxane) can be designed as desired, but is normally about 15 mol % or more, preferably about 20 mol % or more, more preferably about 25 mol % or more, and still more preferably about 30 mol % or more, and can be about 75 mol % or less, preferably about 65 mol % or less, more preferably about 60 mol % or less, preferentially about 55 mol % or less, and particularly preferably about 50 mol % or less.

When the hotmelt silicone of the present disclosure includes (D-1) the linear alkenyl group-containing organopolysiloxane, the content thereof is not particularly limited, but is preferably about 3 mass % or more, more preferably about 5 mass % or more, even more preferably about 8 mass % or more, particularly preferably about 11 mass % or more, based on the total mass of the whole organopolysiloxane components included in the hotmelt silicone composition of the present disclosure. The content of component (D-1) is about 50 mass % or less, more preferably 40 mass % or less, even more preferably 30 mass % or less, particularly preferably about 20 mass % or less, based on the total mass of all organopolysiloxane components included in the hotmelt silicone composition of the present disclosure.

(D-2) Cyclic Alkenyl Group-Containing Organopolysiloxane

The hotmelt silicone composition of the present disclosure may also comprise cyclic alkenyl group-containing organopolysiloxane having at least two alkenyl groups per molecule as component (D-2). The hotmelt silicone composition of the present disclosure may comprise one kind of component (D-2), or two or more kinds of component (D-2) in combination.

The cyclic alkenyl group-containing organopolysiloxane of component (D-2) can be preferably represented by average structural formula (VI): $(R^3{}_2SiO)_n$ (in formula (VI), $R^3$ are the same or different optionally halogen-substituted monovalent hydrocarbon groups, where at least two $R^3$ are alkenyl groups in one molecule, and n is a number at which the viscosity at 25° C. is about 1000 mPa or less).

In formula (VI) above, the same groups for $R^1$ in formula (I) above can be used for the optionally halogen-substituted monovalent hydrocarbon group of $R^3$.

In formula (VI) above, n is a number at which the viscosity at 25° C. is about 1000 mPa or less, for example, from about 4 to about 15, preferably from about 4 to about 10, and still more preferably from about 4 to about 8.

In one embodiment, the content of the alkenyl group included in the cyclic alkenyl group-containing organopolysiloxane of component (D-2) (mol % of the alkenyl group in all of the silicon atom-bonded functional groups of the cyclic organopolysiloxane) can be designed as desired, but is normally about 10 mol % or more, preferably about 20 mol % or more, more preferably about 30 mol % or more, further preferably about 40 mol % or more, preferentially about 45 mol % or more, and can be about 80 mol % or less, preferably about 70 mol % or less, more preferably about 60 mol % or less, and preferentially about 55 mol % or less.

When the hotmelt silicone of the present disclosure includes (D-2) the cyclic alkenyl group-containing organopolysiloxane, the content thereof is not particularly limited, but is about 0.1 mass % or more, more preferably about 0.5 mass % or more, even more preferably about 1 mass % or more, particularly preferably about 2 mass % or more, based on the total mass of the whole organopolysiloxane components included in the hotmelt silicone composition of the present disclosure. The content of component (D-2) is preferably about 15 mass % or less, more preferably about 10 mass % or less, even more preferably about 8 mass % or less, particularly preferably 5 mass % or less, based on the total mass of all organopolysiloxane components included in the hotmelt silicone composition of the present disclosure.
(D-3) Resinous Epoxy Group-Containing Organopolysiloxane The hotmelt silicone composition of the present disclosure may include a resinous epoxy group-containing organopolysiloxane having at least two alkenyl groups and at least one epoxy group per molecule as component (D-3). The hotmelt silicone composition of the present disclosure may comprise one kind of component (D-3), or two or more kinds of component (D-3) in combination.

The resinous epoxy group-containing organopolysiloxane of component (D-3) can be preferably represented by the average unit formula (VII): $(R^4_3SiO_{1/2})_a(R^4_2SiO_{2/2})_b(R^4SiO_{3/2})_c(SiO_{4/2})_d(XO_{1/2})_e$
(in formula (VII), $R^4$ are each independently an optionally halogen-substituted monovalent hydrocarbon group, while at least two $R^4$ are alkenyl groups and at least one $R^4$ is an epoxy group-containing organic group, X is a hydrogen atom or an alkyl group, and $0 \leq a<1$, $0 \leq b<1$, $0 \leq c<0.9$, $0 \leq d<0.5$, $0 \leq e<0.4$, $a+b+c+d=1.0$ and $c+d>0$.

In formula (VII) above, the same groups for $R^1$ in formula (I) above can be used for the optionally halogen-substituted monovalent hydrocarbon groups of $R^4$. Examples of the epoxy group-containing organic groups of $R^4$ include: glycidoxy alkyl groups such as 2-glycidoxyethyl, 3-glycidoxypropyl, and 4-glycidoxybutyl groups; epoxycycloalkyl alkyl groups such as 2-(3,4-epoxycylohexyl)-ethyl and 3-(3,4-epoxycylohexyl)-propyl groups; and epoxyalkyl groups such as 3,4-epoxybutyl and 7,8-epoxyoctyl groups; where glycidoxyalkyl groups are preferable, a 3-glycidoxypropyl group is particularly preferable. $R^4$ is preferably selected from among C1-6 alkyl groups, particularly a methyl group, C2-6 alkenyl groups, particularly a vinyl group, C6-20 aryl groups, particularly a phenyl group, and a 3-glycidoxypropyl group.

In formula (VII) above, a is preferably in the range of $0 \leq a \leq 0.8$, more preferably in the range of $0.05 \leq a \leq 0.6$, and particularly in the range of $0.1 \leq a \leq 0.4$. In formula (VII), b is preferably in the range of $0.05 \leq b \leq 0.7$, more preferably in the range of $0.1 \leq b \leq 0.6$, and particularly in the range of $0.15 \leq b \leq 0.5$. In formula (VII), c is preferably in the range of $0.1 \leq c \leq 0.9$, more preferably in the range of $0.2 \leq c \leq 0.85$, and particularly in the range of $0.3 \leq c \leq 0.8$. In formula (VII), d is preferably in the range of $0 \leq d \leq 0.3$, more preferably in the range of $0 \leq d \leq 0.2$, even more preferably in the range of $0 \leq d \leq 0.1$. In formula (X), e is preferably in the range of $0 \leq e \leq 0.3$, more preferably in the range of $0 \leq e \leq 0.2$, and particularly in the range of $0 \leq e \leq 0.1$.

In a preferred embodiment of the present disclosure, the resinous epoxy group-containing organopolysiloxane of component (D-3) comprises an alkenyl group at a molecular terminal. The resinous epoxy group-containing organopolysiloxane of component (D-3) preferably has an alkenyl group in unit M and optionally has, but preferably does not have, an alkenyl group in unit D or unit T.

The content of the alkenyl group in all of the silicon atom-bonded organic groups of the resinous epoxy group-containing organopolysiloxane of component (D-3) is not particularly limited, and for example, it is about 1 mol % or more, preferably about 5 mol % or more, and more preferably about 8 mol % or more of the total of the silicon atom-bonded organic groups, and can be about 30 mol % or less, preferably about 20 mol %, more preferably about 15 mol % or less of the total of the silicon atom-bonded organic groups.

In a preferred embodiment of the present disclosure, the resinous epoxy group-containing organopolysiloxane of component (D-3) includes an aryl group as a silicon atom-bonded organic group. That is to say, in formula (VII) above, at least one $R^4$ can be an aryl group. In a preferred embodiment of the present disclosure, the resinous epoxy group-containing organopolysiloxane of component (D-3) comprises a silicon atom-bonded aryl group in a molecular-chain side chain, that is, in unit D or unit T, and preferably in unit T. The resinous epoxy group-containing organopolysiloxane of component (D-3) may or may not, and preferably does not, include an aryl group at the molecular terminal, that is, in unit M. Note that, in terms of the aryl group, C6-20 aryl groups, and particularly a phenyl group, a tolyl group, a xylyl group, and a naphthyl group can be mentioned.

When the resinous epoxy group-containing organopolysiloxane of component (D-3) comprises an aryl group, the content thereof (mol % of aryl groups in all of the silicon atom-bonded functional groups of the resinous epoxy group-containing organopolysiloxane) can be designed as desired, and is preferably about 15 mol % or more, more preferably about 20 mol % or more, still more preferably about 25 mol % or more, and particularly preferably about 30 mol % or more, and can be preferably about 70 mol % or less, more preferably about 60 mol % or less, still more preferably about 50 mol % or less, and particularly preferably about 40 mol % or less.

In a preferred embodiment of the present disclosure, the resinous epoxy group-containing organopolysiloxane of component (D-3) comprises a silicon atom-bonded epoxy group-containing organic group in a molecular-chain side chain, that is, in unit D or unit T, and preferably in unit D. The resinous epoxy group-containing organopolysiloxane of component (D-3) may or may not, and preferably does not, include a silicon atom-bonded epoxy group-containing organic group at the molecular terminal, that is, in unit M.

The amount of epoxy group-containing organic groups in all the silicon atom-bonded organic groups in the (D-3) component epoxy group-containing resinous organopolysiloxane is not particularly limited, but is preferably about 1 mol % or more, more preferably about 5 mol % or more, more preferably about 10 mol % or more, and particularly preferably about 15 mol % or less, and is preferably about 40 mol % or less, more preferably about 30 mol % or less, and particularly preferably about 25 mol % or less. The amount of the epoxy group-containing organic group can be determined by analysis such as Fourier transform infrared spectrophotometry (FT-IR) or nuclear magnetic resonance (NMR).

The viscosity of the resinous epoxy group-containing organopolysiloxane of component (D-3) is not particularly limited, but is, for example, in the range of from about 50 mPa to about 50000 mPa at 25° C.

When the hotmelt silicone of the present disclosure includes (D-3) the resinous epoxy group-containing organopolysiloxane, the content thereof is not particularly limited, but is preferably about 0.5 mass % or more, more preferably about 1 mass % or more, even more preferably about 1.5 mass % or more, particularly preferably about 2 mass % or more, based on the total mass of the whole organopolysiloxane components included in the hotmelt silicone composition of the present disclosure. The content of component (D-3) is preferably about 15 mass % or less, more preferably about 10 mass % or less, even more preferably about 5 mass % or less, particularly preferably v3 mass % or less, based on the total mass of all organopolysiloxane components included in the hotmelt silicone composition of the present disclosure.

Optional components can be incorporated into the hotmelt silicone composition of the present disclosure, provided that this does not adversely affect the aim of the present disclosure. Examples of the optional components include an acetylene compound, an organophosphorus compound, a vinyl group-containing siloxane compound, inorganic fillers such as crushed quartz, silica, titanium oxide, magnesium carbonate, zinc oxide, iron oxide and diatomaceous earth, inorganic fillers obtained by subjecting the surface of said inorganic fillers to hydrophobic treatment with an organosilicon compound, hydrosilylation reaction inhibitors, organopolysiloxanes free from a silicon atom-bonded hydrogen atom and a silicon atom-bonded alkenyl group, tack imparting agent, a heat resistance imparting agent, a cold resistance imparting agent, a heat conductive filler, a flame retardant, thixotropy imparting agent, phosphors, solvents, and the like.

The hydrosilylation reaction inhibitor is a component for suppressing the hydrosilylation reaction of the hotmelt silicone composition. Examples of the cure reaction inhibitor include: alkyne alcohols such as 2-methyl-3-butyn-2-ol, 3,5-dimethyl-1-hexyn-3-ol, 2-phenyl-3-butyn-2-ol, and 1-ethynyl-1-cyclohexanol; enyne compounds such as 3-methyl-3-penten-1-yne and 3,5-dimethyl-3-hexen-1-yne; alkenyl group-containing low-molecular weight siloxanes such as tetramethyltetravinylcyclotetrasiloxane and tetramethyltetrahexenylcyclotetrasiloxane; and alkynyloxysilanes such as methyl-tris(1,1-dimethylpropynyloxy) silane and vinyl-tris(1,1-dimethylpropynyloxy) silane. Preferably, the hydrosilylation reaction inhibitor is selected from alkyne alcohols, and is particularly preferably 1-ethynyl-1-cyclohexanol.

The hydrosilylation reaction inhibitor is usually added in an amount of from about 0.001 to about 5 mass % of the total composition of the present disclosure. In a preferred embodiment, the amount of the hydrosilylation reaction inhibitor added is preferably about 0.002 parts by mass or more, more preferably about 0.005 parts by mass or more, even more preferably about 0.01 parts by mass or more, particularly preferably about 0.015 parts by mass or more, with respect to 100 parts by mass of all organopolysiloxane components included in the hotmelt silicone composition of the present disclosure. In addition, the amount of hydrosilylation reaction inhibitor added is preferably about 1 part by mass or less, more preferably about 0.5 parts by mass or less, even more preferably about 0.1 parts by mass or less, particularly preferably about 0.05 parts by mass or less, with respect to 100 parts by mass of all organopolysiloxane components included in the hotmelt silicone composition of the present disclosure.

The hotmelt silicone composition of the present disclosure can be prepared by mixing the components. The method of mixing the components may be a conventionally known method, and is not particularly limited, and a uniform mixture is usually obtained by simple mixing. When a solid component such as an inorganic filler is included as an optional component, it is preferable to use a mixing device for the mixing. There are no particular limitations regarding this mixing device, and examples include single- and twin-screw continuous mixers, double roller mixers, Ross mixers, Hobart mixers, dental mixers, planetary mixers, kneader mixers, Henschel mixers, and the like.

The present disclosure also relates to encapsulant or hotmelt adhesive for semiconductors, which includes the hotmelt silicone composition of the present disclosure. The hotmelt silicon composition of the present disclosure has hotmelting properties and excellent curability, and thus it can be preferably used as an encapsulant or hotmelt adhesive for semiconductors. The encapsulant of the present disclosure may be a substance molded into a sheet form, and this is useful as a material for compression molding. There are no particular limitations regarding the semiconductor to be encapsulated or adhered by the encapsulant or hotmelt adhesive of the disclosure, and examples are semiconductors such as SiC and GaN, particularly power semiconductors, and optical semiconductors such as light-emitting diodes, photodiodes, phototransistors, and laser diodes.

The present disclosure also relates to an optical semiconductor device that is encapsulated with the encapsulant of the present disclosure. The optical semiconductor device can be, for example, a light-emitting diode (LED), semiconductor laser, photodiode, phototransistor, or a light-emitting body or light-receiving body for photocoupler or solid-state imaging; it is particularly preferably a light-emitting diode (LED).

Light-emitting diodes (LEDs) emit light from the upper, lower, left and right sides of the optical semiconductor element, and so it is undesirable for parts constituting the light-emitting diode (LED) to absorb light, and materials having high light transmittance or high reflectance are preferred for said parts. Consequently, the substrate on which the optical semiconductor element is mounted also preferably comprises a material of high light transmittance or high reflectance. As the substrate on which the optical semiconductor element is mounted, for example, conductive metals such as silver, gold, and copper; non-conductive metals such as aluminum and nickel; thermoplastic resins mixed with white pigments such as PPA and LCP; thermosetting resins comprising white pigments such as epoxy resins, BT resins, polyimide resins, and silicone resins; and ceramics such as alumina and alumina nitride may be used.

EXAMPLES

The hotmelt silicone composition of the present disclosure is described in more detail by way of the following examples and comparative examples.

The hotmelt silicone compositions were prepared by mixing the respective components as shown by formulations (parts by mass) in the table. It should be noted that hereinbelow, Me denotes a methyl group, Vi denotes a vinyl group, Ph denotes a phenyl group, and Ep denotes a 3-glycidoxypropyl group. In addition, the structure of the organopolysiloxane components is shown in a simplified manner in the table, and the functional groups other than Me in the unit M, D or T are shown in parentheses. In addition, H/Vi indicates the molar ratio of the silicon atom-bonded hydrogen atom (H) and the vinyl group (Vi) in the organopolysiloxane components.

(Component a: Resinous alkenyl group-containing organopolysiloxane)

Component a-1: Resinous alkenyl group-containing organopolysiloxane represented by the average unit formula $(ViMe_2SiO_{1/2})_{25}(PhSiO_{3/2})_{75}$ Component a-2: Resinous alkenyl group-containing organopolysiloxane represented by the average unit formula $(ViMeSiO_{2/2})_{25}(Ph_2SiO_{2/2})_{30}(PhSiO_{3/2})_{45}$ (Component b: Organohydrogenpolysiloxane)
Component b-1: Resinous organohydrogenpolysiloxane represented by the average unit formula $(HMe_2SiO_{1/2})_{60}(PhSiO_{3/2})_{40}$
Component b-2: Linear organohydrogenpolysiloxane represented by the average structural formula $HMe_2SiO(Ph_2SiO)SiMe_2H$
(Component c: Curing catalyst)
Component c: Complex of platinum having a platinum concentration of 4.0 mass % and 1,3-divinyl-1,1,3,3-tetramethyldisiloxane (Component d: Organopolysiloxanes other than components a and b)
Component d-1: Linear alkenyl group-containing organopolysiloxane represented by the average structural formula $ViMe_2SiO(Me_2SiO)_{20}SiMe_2Vi$
Component d-2: Linear alkenyl group-containing organopolysiloxane represented by the average structural formula $ViMe_2SiO(Ph)_2SiO)_{30}(Me_2SiP)_{60}SiMe_2Vi$
Component d-3: Cyclic alkenyl group-containing organopolysiloxane represented by the average structural formula $(ViMeSiO)_4$
Component d-4: Resinous epoxy group-containing organopolysiloxane represented by the average unit formula $(ViMe_2SiO_{1/2})_{25}(PhSiO_{2/2})_{75}(EpMeSiO_{2/2})_{40}$
(Component e: Hydrosilylation reaction inhibitor)
Component e: 1-ethynyl-2-cyclohexanol The curable hotmelt silicone compositions were prepared by mixing the respective components as shown by formulations (parts by mass) shown in Table 1. Furthermore, the following evaluations were carried out and the results are summarized in Table 1.

Evaluation on Curability

The prepared hotmelt silicone compositions were examined to determine whether or not they cure by being kept at 100° C. for 10 minutes. It was determined whether or not the composition had been cured by considering the self-supporting properties of the hotmelt film. The cured compositions under the abovementioned treatment conditions were classified as "OK" and compositions which did not cure were classified as "NG".

Evaluation on Hotmelting Properties

The prepared hotmelt silicone compositions were applied in a sheet form, heated at 100° C. for 5-10 minutes, thereby preparing cured sheet-like products having a thickness of 1 mm. In regard to these hotmelt cured products, the melt elastic modulus at 100° C. was measured using a viscoelasticity meter (MCR302, manufactured by Anton Paar), and those providing 10-10000 Pa were classified as "OK".

TABLE 1

| Component | Ex. 1 | Ex. 2 | Ex. 3 | Ex. 4 | Comparative Example 1 |
| --- | --- | --- | --- | --- | --- |
| a-1 $M(Vi)_{25}$—$T(Ph)_{75}$ | 30 | 39.8 | 9.9 | 9.9 | 3.4 |
| a-2 $D(Vi)_{25}$—$D(Ph)_2)_{30}$—$T(Ph)_{45}$ | 25.3 | 15.2 | 46.1 | 47 | 53.1 |
| b-1 $M(H)_{60}$—$T(Ph)_{40}$ | 7 | 7 | 5 | 5 | 3.5 |
| b-2 $M(H)$—$D(Ph)_2$—$M(H)$ | 20.1 | 20.4 | 21.4 | 20.5 | 22.8 |
| d-1 $M(Vi)$—$D(Ph)_{20}$—$M(Vi)$ | 12.1 | 12.1 | 12.1 | — | 11.7 |
| d-2 $M(Vi)$—$D_{60}$—$D(Ph_2)_{30}$—$M(Vi)$ | — | — | — | 12.1 | — |
| d-3 $D(Vi)_4$ | 3 | 3 | 3 | 3 | 3 |
| d-4 $M(Vi)_{25}$—$T(Ph)_{75}$—$D(Ep)_{40}$ | 2.5 | 2.5 | 2.5 | 2.5 | 2.5 |
| Total organopolysiloxane components | 100 | 100 | 100 | 100 | 100 |
| C | 0.02 | 0.02 | 0.02 | 0.02 | 0.02 |
| E | 0.02 | 0.02 | 0.02 | 0.02 | 0.02 |
| H/Vi | 1.1 | 1.1 | 1.1 | 1.1 | 1.1 |
| Evaluation | | | | | |
| Curability | OK | OK | OK | OK | NG |
| Hotmelting properties | OK | OK | OK | OK | OK |

As is clear from the abovementioned results, the hotmelt silicone composition of the present disclosure has excellent curability while still maintaining Hotmelting properties.

INDUSTRIAL APPLICABILITY

The hotmelt silicone composition of the present disclosure exhibits excellent curability at low temperatures within a short period of time while still maintaining the hotmelting properties, and thus the composition can be suitably used as an encapsulant or hotmelt adhesive, etc., for semiconductor devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the various embodiments in any way. Rather, the foregoing detailed description will provide those skilled in the art with a convenient road map for implementing an exemplary embodiment as contemplated herein. It being understood that various changes may be made in the function and arrangement of elements described in an exemplary embodiment without departing from the scope of the various embodiments as set forth in the appended claims.

What is claimed is:

1. A hotmelt silicone composition comprising:
(A) a resinous alkenyl group-containing organopolysiloxane component, in which the silicon atom-bonded organic groups do not include an epoxy group-containing organic group, wherein the resinous alkenyl group-containing organopolysiloxane component includes:

(A-1) a resinous alkenyl group-containing organopolysiloxane including at least two alkenyl groups per molecule and free from a $(Ar_2SiO_{2/2})$ unit, and (A-2) a resinous alkenyl group-containing organopolysiloxane including at least two alkenyl groups per molecule and at least one $(Ar_2SiO_{2/2})$ unit;

(B) an organohydrogenpolysiloxane having at least two silicon atom-bonded hydrogen atoms per molecule; and (C) a curing catalyst, wherein the resinous alkenyl group-containing organopolysiloxane (A-1) is included in an amount of about 5 mass % or more based on the total mass of all the organopolysiloxane components in the hotmelt silicone composition;

wherein the component (A-2) is included in an amount of about 50 mass % or less based on the total mass of the organopolysiloxane components in the hotmelt silicone composition;

wherein the component (B) includes a resinous organohydrogenpolysiloxane, wherein the resinous organohydrogenpolysiloxane is included in an amount of 15 mass % or more based on the total mass of the organohydrogenpolysiloxane component (B);

wherein the component (A-1) is free from siloxane units (unit D) represented by $R^1{}_2SiO_{2/2}$;

wherein the component (A-2) includes a siloxane unit (unit D) represented by $R^1{}_2SiO_{2/2}$;

wherein each $R^1$ is independently the same or different optionally halogen-substituted monovalent hydrocarbon group; and wherein the component (A-2) includes a silicon atom-bonded alkenyl group in the siloxane unit (unit D) represented by $R^1{}_2SiO_{2/2}$.

2. An encapsulant or hotmelt adhesive which comprises the hotmelt silicone composition according to claim 1.

3. An optical semiconductor device that is encapsulated with the encapsulant according to claim 2.

4. The hotmelt silicone composition as claimed in claim 1, wherein the component (A) is included in an amount of about 40 mass % or more based on the total mass of all the organopolysiloxane components included in the hotmelt silicone composition.

* * * * *